United States Patent
Tourwe (10) Patent No.: US 7,577,263 B2
(45) Date of Patent: Aug. 18, 2009

(54) SYSTEM FOR AUDIO SIGNAL PROCESSING

(75) Inventor: Bruno Korneel Rene Tourwe, Leuven (BE)

(73) Assignee: NXP B.V., Eindhoven (NL)

( * ) Notice: Subject to any disclaimer, the term of this patent is extended or adjusted under 35 U.S.C. 154(b) by 355 days.

(21) Appl. No.: 10/597,179

(22) PCT Filed: Jan. 10, 2005

(86) PCT No.: PCT/IB2005/050096

§ 371 (c)(1),
(2), (4) Date: Jul. 14, 2006

(87) PCT Pub. No.: WO2005/071830

PCT Pub. Date: Aug. 4, 2005

(65) Prior Publication Data

US 2008/0232612 A1    Sep. 25, 2008

(30) Foreign Application Priority Data

Jan. 19, 2004  (EP) ................................. 04100148
Apr. 27, 2004  (EP) ................................. 04101767

(51) Int. Cl.
*H03G 5/00* (2006.01)
*H03G 3/00* (2006.01)
*H03G 9/00* (2006.01)
*H04R 29/00* (2006.01)
*H03G 3/20* (2006.01)
*H01P 9/00* (2006.01)
*H03G 5/02* (2006.01)

(52) U.S. Cl. ............................ 381/99; 381/98; 381/100; 381/102; 381/103; 381/104; 381/56; 381/58; 381/57; 333/28 R; 333/28 T (58) Field of Classification Search ........... 381/98–100, 381/102–104, 56–58; 333/28 R, 28 T
See application file for complete search history.

(56) References Cited

U.S. PATENT DOCUMENTS

| 4,706,290 A * | 11/1987 | Lin ............................... 381/58 |
| 5,018,205 A * | 5/1991 | Takagi et al. ................... 381/86 |
| 5,200,709 A * | 4/1993 | Saito et al. .................... 330/126 |
| 5,714,918 A * | 2/1998 | Menkhoff .................. 333/28 R |
| 2003/0216879 A1* | 11/2003 | Hashemian ................... 702/95 |
| 2006/0153403 A1* | 7/2006 | Lechner ..................... 381/102 |

FOREIGN PATENT DOCUMENTS

JP          03046897 A  *  2/1991

* cited by examiner

*Primary Examiner*—Devona E Faulk (57) ABSTRACT

A sound reproduction system comprising a digital audio signal input (1), a digital audio signal processor (2, DSP) and a digital audio signal output (3) wherein the digital signal processor (2, DSP) comprises a high pass (HP) filter (21) with a high pass frequency (f), an amplifier (22) for a signal filtered by the HP filter, and a low pass (LP) filter (23) with a low pass frequency (f) for filtering the signal after amplification by the amplifier (22) and for providing an output signal, and the digital processor comprises an establisher (24, 25) for establishing the high pass frequency or the low pass frequency and a matcher (26) for matching the high pass frequency and low pass frequency of the high pass filter and low pass filter respectively to each other.

12 Claims, 10 Drawing Sheets

SYSTEM FOR AUDIO SIGNAL PROCESSING

This invention relates to the field of sound reproduction, and more particularly to the field of digital audio signal processing.

The invention relates to a sound reproduction system comprising a digital audio signal input, a digital audio signal processor and a digital audio signal output.

The invention also relates to an audio signal processor for processing an incoming audio signal in an audio output signal. In particular the invention relates to a digital signal processor (DSP) circuit or program.

The invention also relates to a method for processing a digital audio signal.

A sound reproduction system, such as e.g. a loudspeaker telephone system, includes an output transducer, often called a loudspeaker, and an input for an audio signal. The loudspeaker produces sound pressure waves in response to the audio input signal which is representative of a desired sound pressure wave.

Intelligibility of the sound as perceived by the listener is very important, especially in noisy environments. The simplest way to increase the intelligibility is to increase the average SPL (Sound pressure level), i.e. turning up the volume. However, simply turning up the volume does not always lead to a more intelligible sound. Also, too high an output may lead to an overloading of a loudspeaker resulting in a further decrease of the intelligibility.

A number of attempts have been made to increase the intelligibility of sound

United States Patent application US 2002/0015503 proposes e.g. to increase intelligibility by individually constraining the gain factors for different frequency bands.

U.S. Pat. No. 6,011,853 describes a system in which the frequency spectrum of the noise is measured and the speech signal is equalized for the effect of noise at a particular frequency.

The existing systems and methods are, however, either very complicated, requiring complicated computations and thereby complicated circuitry (hard-ware), or, in the case of a program (soft-ware) being used, a complex program, or supply only a limited advantage.

Notwithstanding the above-mentioned reference, there continues to exist a need in the art for improved systems and methods providing improved intelligibility.

It is an object of the present invention to provide a sound reproduction system and method with improved intelligibility.

To this end, the sound reproduction system in accordance with the invention is characterized in that the system comprises a digital signal processor, the digital signal processor comprising a high pass (HP) filter with a high pass frequency, an amplifier for amplification of a signal filtered by the HP filter, and a low pass (LP) filter for filtering the signal after amplification and for providing an output signal, and the digital processor comprises an establisher for establishing the high pass frequency or the low pass frequency and a matcher for matching the high pass frequency and low pass frequency of the high pass filter and low pass filter respectively to each other.

The system in accordance with the invention is based on the following insights:

1. The incoming signal is amplified (by the amplifier), to increase the loudness, however
2. increasing the incoming signal could lead to a signal higher than the maximum digital signal, in such circumstances the signal would often be digitally clipped, leading to a distortion of the signal.
3. Low frequencies are removed from the signal prior to amplification, this allows the remainder of the signal to be amplified with, on average, a higher gain factor. This is done by the HP filter, situated before amplification. The lower frequencies are, in so far as intelligibility is concerned, of relatively low importance. The lower frequencies comprise much of the amplitude of the signal, so removing the lower frequencies strongly reduces the amplitude of the signal, creating headroom for amplification, i.e. a stronger amplification for the remainder of the signal. A large part of the amplitude of especially speech is comprised in the lower frequencies so attenuating lower frequencies allows for a considerable increase in head room (i.e. amplification without hitting a clipping level).
4. Simply cutting the lower frequencies and increasing the output would lead to an increase in intelligibility, however it does not always lead to a readily perceivable increase in intelligibility. Due to the use of the high pass filter, the signal comprises a relatively high proportion of high frequency tones leading to a perceptually annoying shrill signal, a discoloration of the audio signal, reducing the intelligibility. Furthermore the amplification may lead to the introduction of the overtones. The low pass (LP) filter, after amplification, restores the balance, and in addition may cut out or at least reduce the overtones produced by the amplifier leading to a more natural sound, reducing at least in part the discoloration of the signal and increasing the intelligibility.
5. Within the system in accordance with the invention the cut-off frequencies are matched, i.e. that there is a relationship between the established HP cut-off frequency and the LP cut-off frequency, wherein the value of the low pass frequency and/or the high pass frequency are matched in opposite directions, meaning that if the HP cut-off frequency is reduced (lowered) the LP cut-off frequency is increased and vice versa, or to put it differently the cut-off action of the HP filter and LP filter are matched, in that if one action is large, the other is too, and if one action is relatively small, the other is too. The HP and LP filters thus are used as coupled elements in the speech or sound processing, they are not elements with unrelated parameters. The cut-off action of the high-pass filter provides for a discoloration of the audio signal, and the LP filter's cut-off action is matched to counteract this effect. The system has a means for establishing either the HP or LP cut-off frequency and matching the LP or HP cut-off frequency to the established frequency.

There are several preferred embodiments:

In embodiments the system comprises a sensor for measuring back-ground noise level, and comprises an element having as an input the measured noise level and as an output the HP cut-off frequency, wherein the HP cut-off frequency increases as the background noise level increases, and the LP cut-off frequency decreases as the HP cut-off frequency increases. This decrease of the LP cut-off frequency may be performed by changing (decreasing) the cut-off frequency of a single LP filter as a function of the HP cut-off frequency, or, alternatively, the system may comprises a set of different LP filters, and dependent on the HP cut-off frequency the signal, after amplification is directed to one of the set of LP filters. The latter embodiment is particular useful if more complex LP filters are used, having more than one variable, i.e. more parameters being changed than just the LP cut-off frequency.

This selection may be performed with a look up table wherein dependent on the HP cut-off frequency the signal undergoes different digital calculations equivalent to different LP filters. This may be performed in two steps, in which in a first step the noise level is determined, this triggers a choice of the HP cut-off frequency, and then from the HP cut-off frequency the LP cut-off frequency is chosen.

Preferably the system, and/or program comprises a means for establishing the cut-off frequency of the high pass filter in dependence on the average amplification in the amplification stage. The average amplification is a measure for the average gain of the signal and thereby of the loudness level of the emitted sound signal. It is advantageous when the HP cut-off frequency of the high-pass filter increases with increasing average loudness level of the emitted signal, and in addition the cut-off frequency of the low pass filter is matched, i.e. decreases in step with the changing HP cutoff frequency. At very high amplification levels (as could happen when the system is used in loud, noisy environments) there is a large need for the filtering action of the HP filter which introduces a relatively large unbalance in sound and in addition the large amplification level itself may introduce a relatively large distortion of the signal, wherein the unwanted, unnatural overtones of the signal after amplification comprise much energy. This leads to a harsh sound. The harshness of the sound sometimes and even often, as the inventors have realized leads to the listener keeping the loudspeaker, especially in mobile telephones, at some distance from the ear. Apart from the fact that holding the loudspeaker at some distance from the ear in itself will lead to a considerable reduction in signal to noise, since the signal will be reduced and the noise will be increased, the mere fact that the sound itself is perceived as harsh in fact means a reduction in intelligibility of the message given. For vocal messages the harshness of the voice often is an integral part of the message which the person speaking wishes to address the listener, sometimes even more important than the actual words of the messages. It is thus important for the intelligibility of the message, seen in a concept broader than merely whether or not words are understood, that a clear "natural" voice transfer is achieved. At lower amplification levels the "harsh sound" effect, i.e. the discoloration of the signal is much less audible. In short, at high amplification levels there is a relatively large unbalance in the signal (much more energy in high frequencies) and in addition a relatively large part of the amplitude at high frequencies is due to artificial artifacts due to the amplification, and removing (in toto or partially) the higher frequencies removes the unbalance and artifacts thus leading to a more natural sound, whereas at relatively low amplification levels, considerably more of the signal amplitude at high frequencies is of natural origin and much less due to artificial artifacts, so setting the cut-off frequency at a relatively high frequency is then preferable. By establishing the cut-off frequency of the high pass filter dependent on the amplification and simultaneously matching the cut-off frequency of the low pass filter an improved sound reproduction is possible. To some extent this embodiment aims to have a similar effect as the first mentioned embodiment with a noise sensor, however, instead of coupling the matched cut-off action of HP and LP filter to a measured noise level, the matched LP and HP filter cut-off action is coupled to an amplification level. Usually the higher amplification levels will be used in high background noise levels, (a user will turn up the volume in noisy environments) so in a sense the user then acts as a noise sensor. Using a noise sensor as a part of the system is from a technical point of view preferred, but will increase the cost and complexity of the system.

In embodiments the system comprises means to measure/establish the sample frequency fs of the incoming signal and set the maximum cut-off frequency of the LP filter at fs/2. Any signal above fs/2 is not a component of the original signal, but due to overtones. The sample frequency fs thus in fact determines the maximum cut-off frequency of the LP filter. Therefore in these embodiments the cut-off frequency has an upper limit of fs/2. The sample frequency fs may be determined by the bandwidth of the incoming signal. For instance for Internet audio-video the bandwidth is often rather small. Also, if the audio system itself has a rather low power, there is not much use in having a very large bandwidth. So, in preferred embodiments the system has means to establish the sample frequency of the signal, which may be established from the incoming signal, or may be established as a function of the power restriction of the audio system (for instance if the system may be hooked up to different physical amplifiers and thus power restrictions may apply). For high values of fs, for instance 44 kHz, this does not have much influence on the cut-off action of the low pass filter, however this is not the case for low values of fs (such as for instance 8 kHz, 11.025 kHz, 16 kHz, 22.05 kHz fs/2 is rather small 4 kHz, 5.5 kHz, 8 kHz respectively 11 kHz). This restriction however 'colors' the sound, since frequencies above fs/2 are absent, in fact the original signal as received is already 'discolored'. The system in the preferred embodiment has a means for determining the HP cut-off frequency in dependence of the established sample frequency fs to counteract the discoloration. Again, this may be done in several manners: The increase of the HP cut-off frequency may be performed by changing (increasing) the cut-off frequency of a single HP filter as a function of the LP cut-off frequency, or, alternatively, the system may comprises a set of different HP filters, and dependent on the cut-off frequency the signal is lead to one of the set of HP filters. The latter embodiment is particular useful if more complex filters are used, having more than one variable, i.e. more parameters being changed than just the cut-off frequency. This selection may be performed with a look up table wherein dependent on the LP cut-off frequency the signal undergoes different digital calculations equivalent to different HP filters.

In most preferred embodiments the system combines both of the preferred embodiments, i.e. it comprises means for, on the one hand, establishing the sample frequency fs and then determining the HP cut-off frequency on the basis of the fs value, and on the other hand, measuring the noise level and determining the HP cut-off filter value and then determining the LP cut-off filter frequency.

Preferably the high pass frequency lies between 300 and 2 kHz, the low pass frequency lies above 2 kHz and fs/2 where fs is the sample frequency.

Preferably the amplifier is arranged not to amplify a signal having a signal strength below a threshold value.

Below a threshold value (a certain minimum amplitude) the signal is probably due to noise. Not amplifying such signals improves intelligibility, since the noise is reduced. Furthermore the difference between silence and speech is better distinguishable, which also increases intelligibility. The threshold may be set at initialization time or at run time, in case the user needs to set the threshold value, e.g. when making several phone calls, since the signal noise can depend on the GSM provider or the GSM device used by the far end user.

The high pass filter is preferably a first order or second order filter, i.e. a filter with a relatively gradual slope. It is advantageous to remove much of the energy of the low frequency components of the incoming signal to provide head room for the amplification. However, a filter with a slope that is relatively steep (a step filter being the most extreme example of such a filter) removes so much of the lower frequency components that this may result in an unnatural sounding voice. Preferably the system comprises a means for enabling a user to change the order and/or the cut/off frequency. Using a $2^{nd}$ order high pass filter results in good speech intelligibility and/or signal loudness, whereas using a $1^{st}$ order high pass filter will preserve the more natural sound of the original signal.

In a preferred embodiment the system comprises the high pass (HP) filter followed by an AGC followed by a limiter/clipper followed by the low pass (LP) filter. This embodiment is preferred when in circumstances where signal loudness is of prime interest. A limiter scans for peaks in the audio signal and attenuates the audio portion around the peak if the attenuation is necessary to limit the amount of clipping, while yet for very loud signals allowing for clipping.

In a different preferred embodiment, the system comprises an automatic volume leveler preceded or preferably followed by the high pass (HP) filter, providing a leveled signal, followed by a gain, and a clipper, followed by the low pass (LP) filter. This embodiment is preferred when low computational effort is preferred (Hard) clipping is a simple operation in which any signal above a threshold signal strength is reduced to said given threshold signal strength, i.e. a maximum signal strength is set. The advantage of such an embodiment is that a simple system is used, the disadvantage is that the signal is more heavily distorted, since any details in the signal above the threshold signal are lost.

In all embodiment the HP and LP cut-off frequencies are coupled. This forms the core of the invention, the HP and LP filter actions are matched wherein the discoloration due to the application of the one filter is at least partly compensated by the action of the other filter. Often the 'leading filter' will be the HP filter, i.e. the HP cut-off frequency will be established on the basis of a parameter and the LP cut-off frequency will follow, but in embodiments wherein the incoming signal has a small sample frequency the 'leading filter' may be the LP filter.

In preferred embodiments the system comprises a measuring system, such as a microphone, for measuring background noise levels.

Preferably for one or more of the parameters the dependency on the measured noise level is non-linear.

Within the concept of the invention a 'clipper', 'compressor', 'amplifier', 'filter', 'converter', 'comparator' etc are to be broadly understood and to comprise e.g. any piece of hard-ware (such as a clipper, compressor, amplifier etc), any circuit or sub-circuit designed for performing a clipping, compression, amplification etc function as described as well as any piece of soft-ware (computer program or sub program or set of computer programs, or program code(s)) designed or programmed to perform a clipping, compressing, filtering etc operation in accordance with the invention as well as any combination of pieces of hardware and software acting as such, alone or in combination, without being restricted to the below given exemplary embodiments. One program may combine several functions.

The invention is also embodied in any computer program comprising program code means for performing a method in accordance with the invention when said program is run on a computer as well as in any computer program product comprising program code means stored on a computer readable medium for performing a method in accordance with the invention when said program is run on a computer, as well as any program product comprising program code means for use in a telephone system in accordance with the invention, for performing the action specific for the invention.

These and further aspects of the invention will be explained in greater detail by way of example and with reference to the accompanying drawings, in which.

The present invention will now be described more fully hereinafter with reference to the accompanying drawings, in which preferred embodiments of the present invention are shown. This invention may, however, be embodied in many different forms and should not be construed as limited to the embodiments set forth herein. Like numbers refer to like elements throughout.

Figure 1:
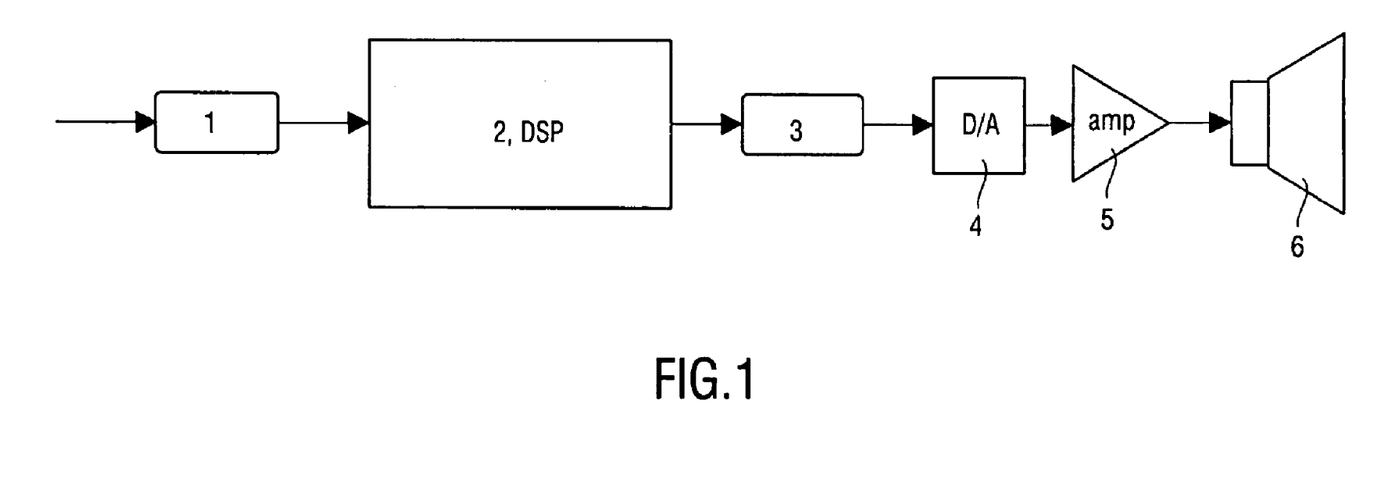
FIG. 1 is a schematic diagram of a system including a loudspeaker, and a DSP.

FIG. 1 illustrates schematically a sound reproduction system. Such system can for instance be a hands-free loudspeaker cellular radiotelephone for use in an automobile. When implemented as a hands-free cellular telephone, speech signals received from a far end, i.e. from a distant party, are transmitted from a cellular base station (not shown), received by the transceiver of the cellular phone (not shown), and applied to the input 1 for an incoming far end signal as an input waveform W. In this example it is assumed that the transmission back and forth between the system, in this example a telephone system, and the far end is in a digital form. If the original signals are in an analog form the system comprises an A-to-D converter to generate a digital far end signal which is then fed into input 1.

As shown in FIG. 1, the waveform is applied in a digital format at input 1 of or connected to a DSP (digital sound processor) 2, which is connected to or which comprises a digital output 3. The digital signal output is fed to and converted to an analog format by D-to-A converter 4 and amplified by amplifier 5 for use by the loudspeaker 6. A sound pressure wave W1 representative of the speech of the distant party is emitted by loudspeaker 5. Accordingly, the radiotelephone user hears sound pressure waveforms which are representative of the speech of the distant party.

However, the listener does not just hear the sound generated by the loud speaker, but also other sounds, which may make the sound generated by the loud speaker difficult to understand, i.e. of low intelligibility.

Turning up the volume seems a first and obvious choice to increase the intelligibility. However, the maximum output level of the loud speaker is often limited and simply turning up the volume often leads to more noise, not necessarily a better intelligibility of the signal.

To improve the intelligibility a number of co-operating measures are taken in the system and method in accordance with the invention.

Figure 2:
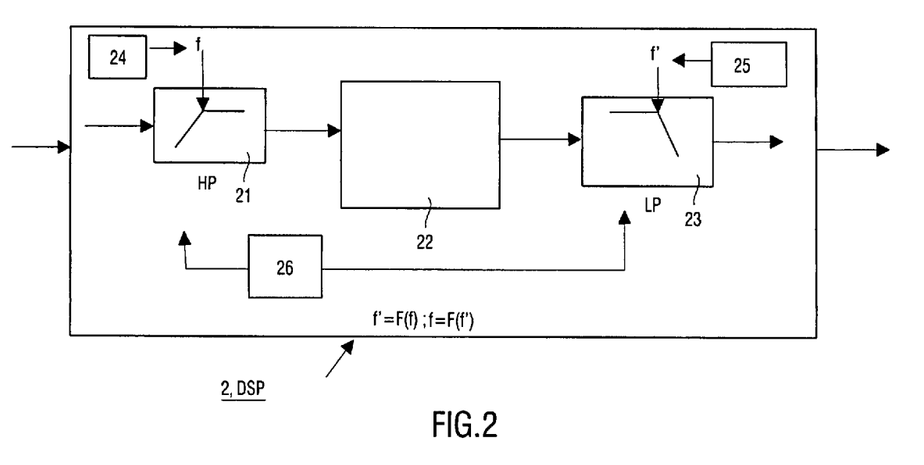
FIG. 2 shows schematically a DSP in accordance with the invention

FIG. 2 illustrates very schematically a DSP (digital sound processor) for use in a system in accordance with the invention. The DSP comprises a high pass (HP) filter 21 with a cut-off frequency e.g. and preferably between 300 Hz and 2 kHz, e.g. between 500 and 1500, more preferably between 800 and 1200 Hz. The high pass filter removes or reduces frequency components below the cut-off frequency f.

By the HP filter most of the energy of the signal has thereby been removed. This enables the remaining signal to be much more amplified (before running into problems in regards to a digital clipping, i.e. a value higher than the maximum value) by amplifier 22. The HP filtering, however, increases the high frequencies relative to the low frequencies, leading a shrill sound. The application of a low pass filter (LP) 23 after the amplification restores, at least in part the 'naturalness' of the sound. In the system in accordance with the invention the HP and LP cut-off frequencies f and f' are matched, schematically indicated by the arrows between HP and LP filters. The system has a means for establishing either one of the frequencies f or f' and once one of these frequencies is established establishing the other frequency.

In the system in accordance with the invention the cut-off frequencies and thereby the actions of the HP and LP filter are matched, i.e. they are inter-correlated. As described to this end the system comprises on the one hand an establisher 24, 25 to establish the HP or LP cut-off frequency f or f', and a matcher 26 to match the LP or HP cut-off frequency to the established HP or LP cut-off frequency. In all embodiment the HP and LP cut-off frequencies are coupled. This forms the core of the invention, the HP and LP filter actions are matched wherein the discoloration due to the application of the one filter is at least partly compensated by the action of the other filter. "Matching" means that there is a relationship between f and f', i.e. f=F(f') or f'=F'(f). Often the 'leading filter' will be the HP filter, i.e. the HP cut-off frequency will be established on the basis of a measured or determined parameter and the LP cut-off frequency will follow, but in embodiments wherein the incoming signal has a small sample frequency the 'leading filter' may be the LP filter.

Figure 3:
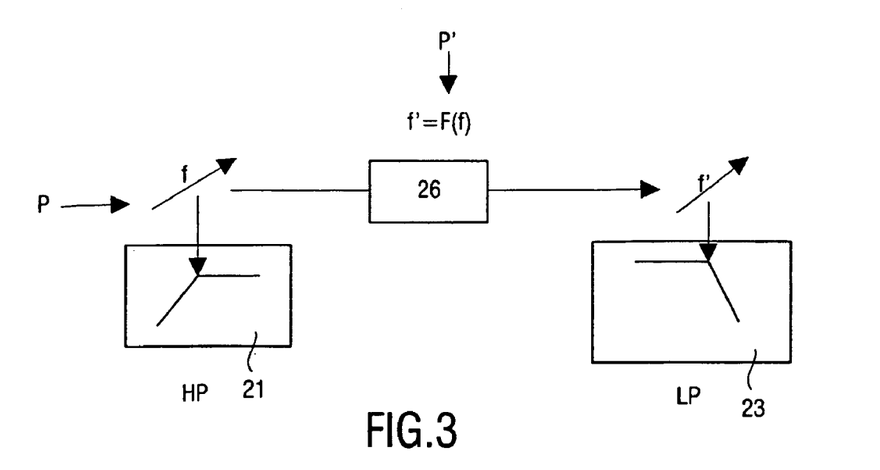
FIG. 3 illustrates schematically matching of LP filter frequency to HP filter frequency

FIG. 3 illustrates schematically a high pass filter with a high pass filter frequency f, this filter frequency f may be influenced a parameter P, such as environment noise level, line noise level, a parameter set by the user, or the amplification. The establisher establishes the HP cut-off frequency in dependence of such parameter or parameters. This influence is schematically indicated by the transverse arrow through the frequency f and the arrow between P and f. The system comprises a matcher which matches the low pass frequency f' of the low pass filter 23 to the HP filter frequency f. "Matching" in the present invention should not be interpreted as meaning that f is made equal to f' or vice versa, but that a relationship is established between the value f and the value f', i.e. f'=F(f) where F stands for a function. This may be a fixed relationship, i.e. a fixed function F, or the function may be dependent itself on further parameters, which in FIG. 3 is schematically shown by the letter P' and the arrow between this letter and the function F. Parameters may be for instance the environmental noise level N, line noise level, or the amplification (gain) of the amplifier in between the HP and LP filter. In such a case the relation between f and f' may be represented by f'=F(f, P').

Figure 4:
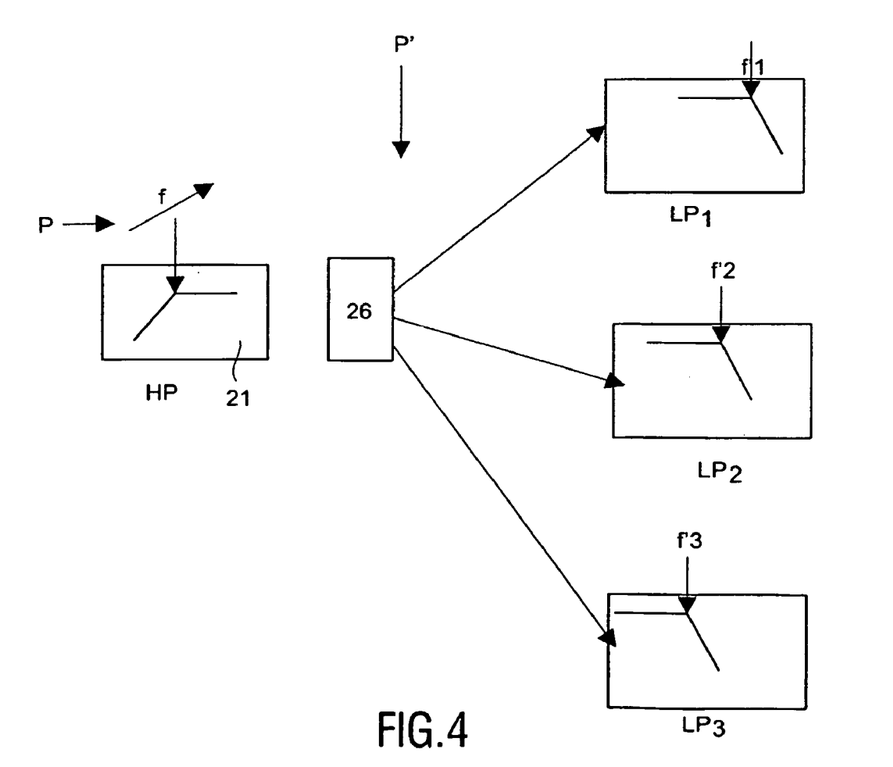
FIG. 4 illustrates schematically an alternative manner of matching LP filter frequency to HP filter frequency

FIG. 4 illustrates a variation on the scheme shown in FIG. 3. In this embodiment a number of LP filters are used, and, dependent on the established HP cut-off frequency f, and possibly additional parameters P', the signal is, after amplification by amplifier 22, led, using the matcher, to one of the LP filters, each filter having a cut-off frequency f'. This is schematically shown in FIG. 4 by the different arrows interconnecting the HP filter and one of the LP filters, and by the fact that the cut-off frequency is different in the different LP filters.

Such an embodiment is more complicated then the embodiment in which a single LP filter is used, however. The latter embodiment is particular useful if more complex LP filters are used, having more than one variable, i.e. more parameters being changed than just the LP cut-off frequency, for instance also the order of the filter. This selection may be performed with a look up table wherein dependent on the established HP cut-off frequency the signal undergoes different digital calculations equivalent to different LP filters. This may be performed in two steps, in which in a first step the noise level is determined, this triggers a choice of the HP cut-off frequency, and then from the HP cut-off frequency the LP cut-off frequency is chosen. The choice may be dependent on additional parameters.

Figure 5:
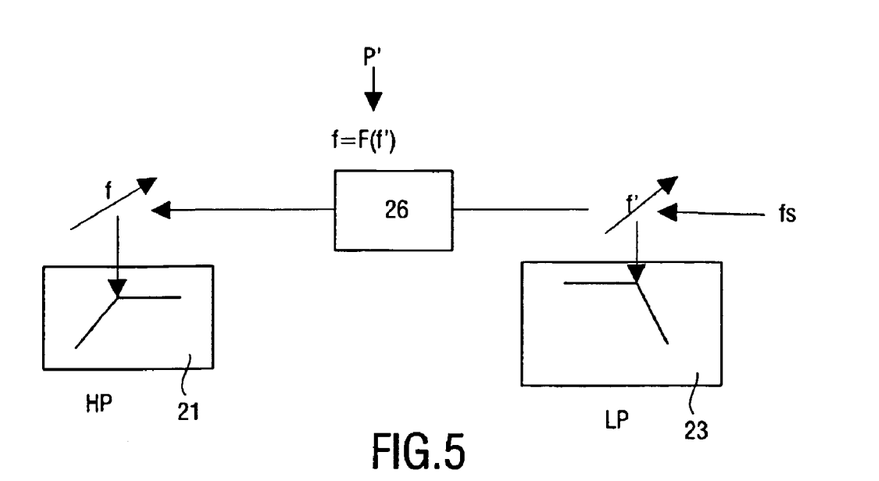
FIG. 5 illustrates schematically matching of HP filter frequency to LP filter frequency

FIG. 5 illustrates schematically an embodiment in which the LP filter frequency is established, as a function of the sample frequency fs and the HP filter cut-off is a function of the established LP filter cut-off frequency f', i.e. f=F(f'), the matcher 26 matches the frequencies f and n f, i.e. calculates f on the basis of the established frequency f'. In some embodiments the function F itself is dependent on other parameters P', such as e.g. the noise level.

Figure 6:
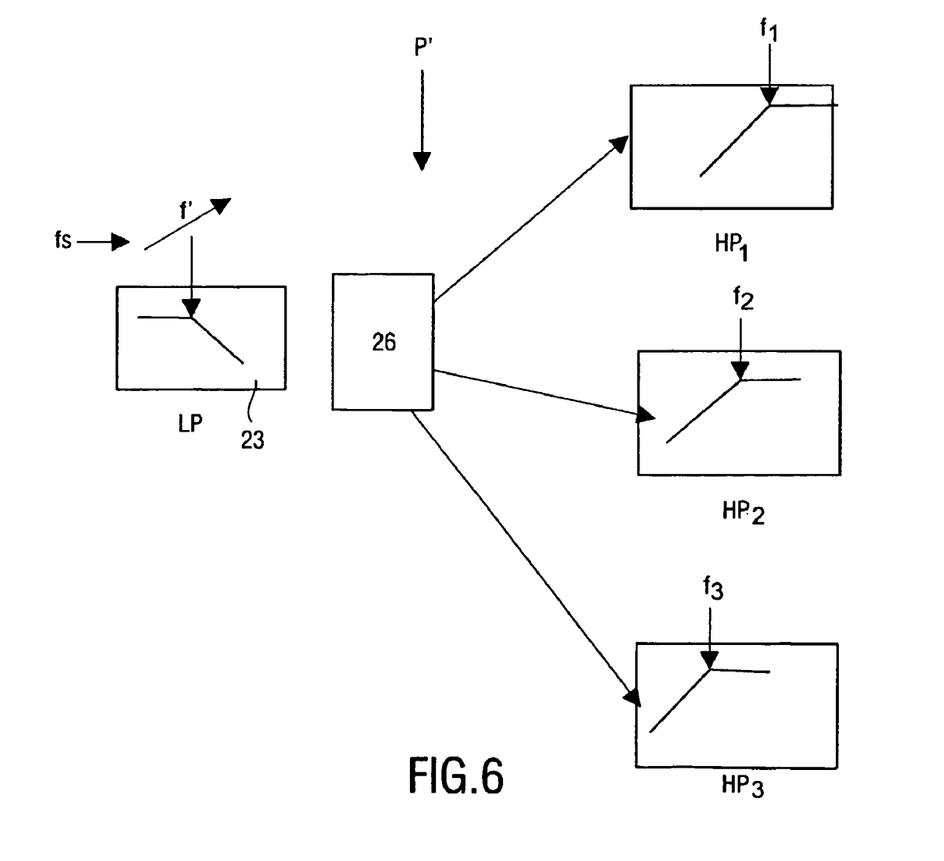
FIG. 6 illustrates schematically an alternative manner of matching HP filter frequency to LP filter frequency

FIG. 6 illustrates a variation of the embodiment illustrates in FIG. 5. In this embodiment a number of HP filters are used, and, dependent on the established LP cut-off frequency f', and possibly additional parameters P', the signal is, after amplification by amplifier 22, led to one of the HP filters, each filter having a cut-off frequency f. This is schematically shown in FIG. 6 by the different arrows interconnecting the LP filter and one of the HP filters, and by the fact that the cut-off frequency is different in the different HP filters.

Such an embodiment is more complicated then the embodiment in which a single HP filter is used, however. The latter embodiment is particular useful if more complex HP filters are used, having more than one variable, i.e. more parameters being changed than just the HP cut-off frequency, for instance also the order of the filter. This selection may be performed with a look up table wherein dependent on the established LP cut-off frequency the signal undergoes different digital calculations equivalent to different HP filters. This may be performed in two steps, in which in a first step the sample frequency fs is determined, this triggers a choice of the LP cut-off frequency, and then from the LP cut-off frequency the HP cut-off frequency is chosen. The choice may be dependent on additional parameters.

Figure 7:
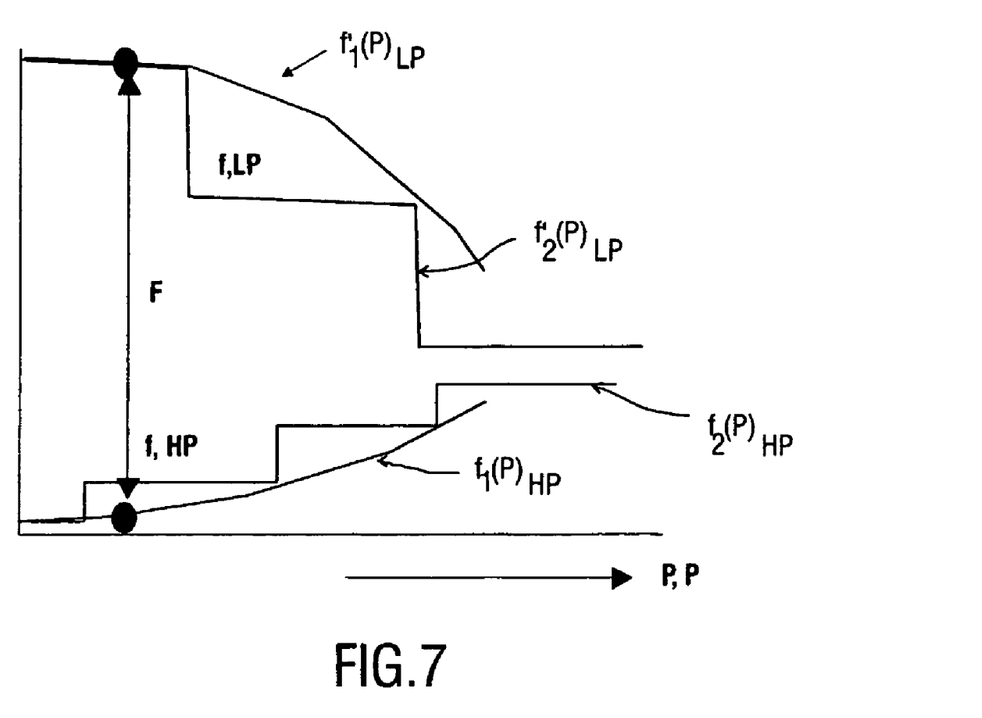
FIG. 7 illustrates matching of LP and HP filter frequency in a graphical form.

FIG. 7 illustrates in a graphical form the relation between the LP cut-off frequency f' and the HP cut-off frequency f. The relation is found by drawing a vertical line for a particular value of the parameters (e.g. the noise) between the HP (f) and LP (f') cut-off frequency graphs, and reading the corresponding curve values (indicated by the double-headed arrow). As shown schematically, the graphs may be continuous ($f'_1(P)_{LP}$ and $f_1(P)_{HP}$), or stepped ($f'_2(P)_{LP}$ and $f_2(P)_{HP}$), as may be for instance the case when a number of distinct LP of HP filters are used. The curves themselves may be dependent on parameters P and/or P', such as for instance a measured noise level N, the line noise level, the chosen amplification level (when such may be set by the user), the same frequency fs.

The amplification is done by an amplifier 22 (see FIG. 2). This amplifier 22 is preferably a compressing amplifier. A compressing amplifier is an amplifier which amplifies the signal but also levels the average sound level, i.e. sounds having a small amplitude are more amplified than sound having a high sound level, thus reducing the signal amplitude range. This may be done in several manners e.g. a clipper/limiter arrangement, a clipper/compressor or an AVL (automated voltage leveler) followed by a gain and a clipper. A number of different techniques may be used, including using look-up tables to perform the amplification and compression. The amplitude range, in particular the upper limit of the range may be set by the manufacturer or influenced by the user e.g. by means of a loudness setter (a knob with which the user may set the loudness). Compared to a straight forward, linear amplification of the signal (i.e. for all sound levels an equal amplification factor) a compressed amplification leads to more intelligibility of the sound, especially in case the environmental noise is high, causing the silent voice parts to be masked by the background noise. The words are more easily distinguishable, and thus the intelligibility of the sound is improved.

It could also lead, however, to a distortion of the sound since the non-linear amplification of the sound introduced overtones (high frequency components at double, triple etc the original frequency) which leads to an increased harshness of the sound. This is perceived by the listener as being unpleasant, and in fact, in an important sense, reduces the intelligibility, in a broader sense, of the vocal message, since the harshness of the spoken words often forms an important aspect of the vocal message. This effect is present even without clipping, although the clipping itself also introduces overtones, even more distorting the signal.

Intelligibility in a broader sense does not just relate to the words as such, but also to the message the speaker wishes to convey to the listener. The harshness of the sound, especially at higher average amplification, makes everybody sound angry, thus strongly reducing the finesses in emotions the speaker wishes to convey.

The application of a low pass filter, as in the inventive system, depicted in FIG. 2, after the compressing amplifier reduces the perceived harshness of the voice, restoring at least to some extent the original emotional content of the spoken words, i.e. giving a much more natural sound.

It is remarked that in most western languages the pitch of a word influences the emotional impact of the word, but not the meaning of the word per se. However, there are languages in which the pitch of the word plays a much larger role, leading to completely different meanings for one and the same "word" depending on the pitch of the word. When such languages are used (which cannot be excluded) the use of the low pass filter becomes even more advantageous. The invention is in particular of advantage when used in conjunction with or in automated speech recognition systems, especially for languages in which the pitch of the spoken word influences the meaning of the words. What is above discussed in relation to spoken words, i.e. voice, equally applies when the sound reproduction system is used to reproduces music. Also in music the way music is perceived is of course dependent on whether one can hear the notes, but also the harshness of the sound is very important. The invention is thus, although of great importance to systems in which vocal messages are relayed such as telephone systems, not restricted to such systems, systems for reproducing music may equally benefit of this invention.

A leveling or compression action may be performed before HP filtering of the incoming signal or after it has been HP filtered. The amplification per se (i.e. the gain) is done after HP filtering. The clipping is done after the gain or in conjunction with the gain. When use is made of a clipper the low pass filter is positioned after the clipper.

As explained above the relation between HP and LP cut-off frequency may be fixed or dependent on a number of parameters.

The amplification stage and/or the clipping stage may also lead to a discoloration of the signal, in more sophisticated embodiments of the system the matcher for matching the HP and LP frequency comprises an input for at least one parameter of the element between the HP and LP filter, such as the amplifier and/or clipper, whereby the relation between the HP and LP cut-off frequency is dependent on said parameter(s), i.e. f'=F(f,P) of f=F'(f',P') where P and P' stands for the parameter(s) of such intermediate elements. For instance non-linearities introduced by a clipper and/or a leveling amplifier may introduce higher overtones, so dependent on the presence or the effectiveness of such elements the LP filter cut-off action of the LP filter may be increased.

Figure 8:
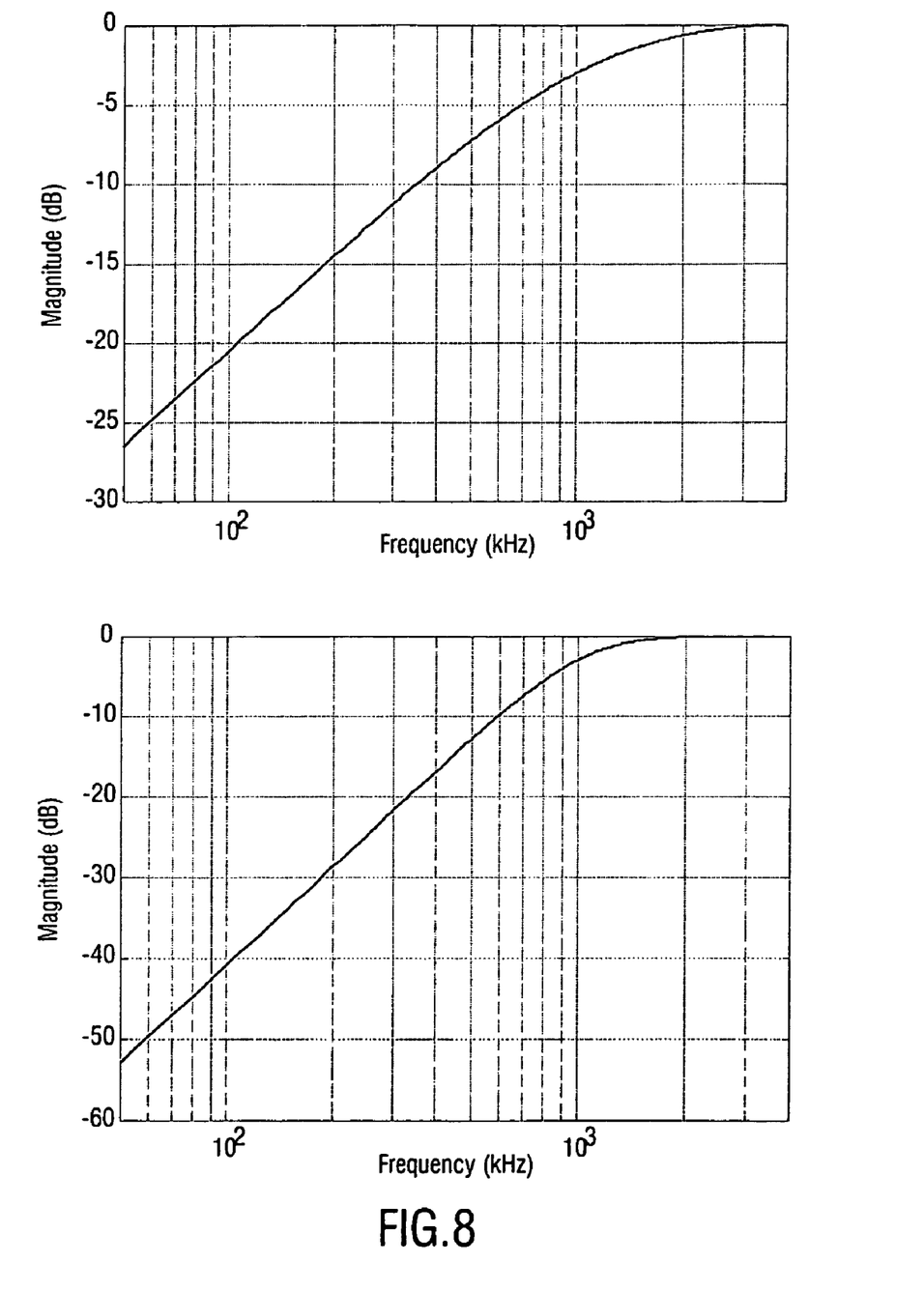
FIG. 8 shows two examples of high pass filters which may be used in the invention.

FIG. 8 gives two examples of high pass filters usable in a system in accordance with the invention.

The left hand side of the figure illustrates a $1^{st}$ order filter, the right hand side a second order filter. The shown high pass filter have a cut-off frequency f of approximately 1 kHz. First or second order high-pass filters (which have relatively moderate sloops of 5-15 dB per octave) are preferred. Removing too much of the low frequencies component results in a very unnatural sounding voice (or unnatural odd sounding music) Therefore the order of the high pass filter is preferably limited at 2. This also reduces the computational power required. Preferably the user can change the high pass filter from $1^{st}$ to $2^{nd}$ order and vice versa, or the system comprises an automatic switching mechanism dependent on the incoming signal. Using the $2^{nd}$ order results in high speech intelligibility (in restricted sense, i.e. only the words) and/or signal loudness, whereas the $1^{st}$ order HP filter will better preserve the natural sound of the original signal.

The HP filter may for instance consist of a biquad whose coefficients are listed in Table 1, according to the format

TABLE 1

$$H(z) = \frac{b_0 + b_1 z^{-1} + b_2 z^{-2}}{1 + a_1 z^{-1} + a_2 z^{-2}}.$$

Filter coefficients of the HP filters depicted in FIG. 3.

| | $1^{st}$ order | $2^{nd}$ order |
|---|---|---|
| $b_0$ | 0.70710678118655 | 0.56903559372885 |
| $b_1$ | −0.70710678118655 | −1.13807118745770 |
| $b_2$ | 0.00000000000000 | 0.56903559372885 |
| $a_1$ | −0.41421356237310 | −0.94280904158206 |
| $a_2$ | 0.00000000000000 | 0.33333333333333 |

The lower frequencies contribute mainly to the specific sound of the voice, but less to the speech intelligibility. This property forms one aspect of the invention.

By attenuating the lower frequencies, the signal amplitude will decrease significantly creating headroom to amplify the remaining signal which contains relatively more frequencies contributing to the speech intelligibility.

When amplifying the speech signal afterwards, even when compressing and clipping it, the speech intelligibility will be better than without the use of the HP filter for mainly two reasons:

the signal contains relatively more frequencies contributing to the speech intelligibility the low frequencies are less hard clipped, resulting in less harmonics (due to clipping) disturbing the speech intelligibility.

Removing too much of the low frequencies, however, would results in a very unnatural sounding voice. Therefore, the HP filter is preferably only first order e.g. a Butterworth (first order IIR) filter. This had the advantage of little computational power consumption.

Figure 9:
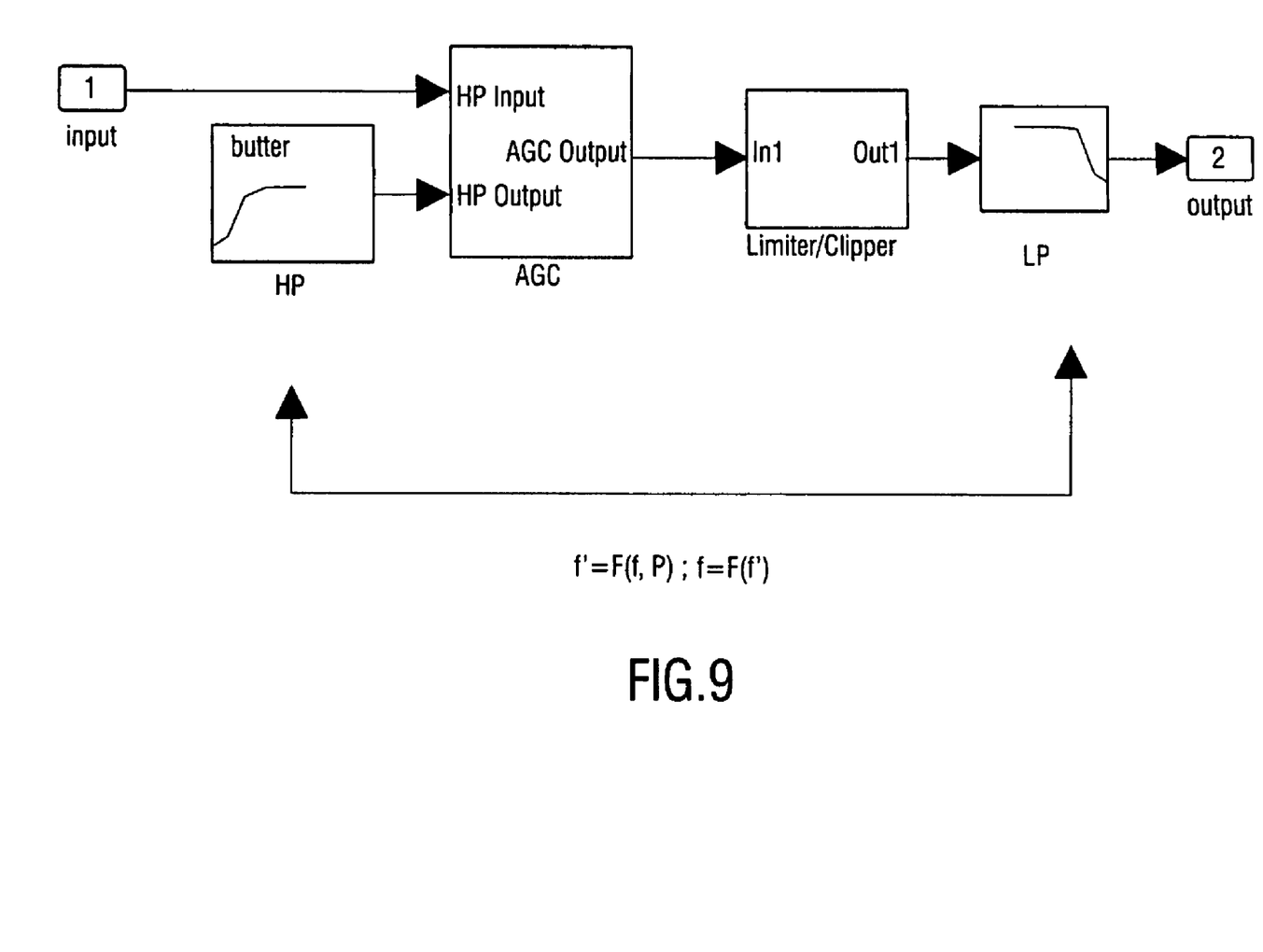
FIG. 9 illustrates one type of embodiments of the invention.

FIG. 9 illustrates a detail on a system in accordance with an embodiment of the invention.

The DSP comprises a HP filter (for instance one as illustrated in FIG. 8, in this example for instance a Butterworth $1^{st}$ or $2^{nd}$ order filter with a cut-off frequency value of for instance between 50 and 2 kHz), followed by an AGC, followed by a limiter/clipper, followed by a low pass filter (LP), with a cut-off frequency between 2 kHz and fs/2.

In this example all audio streams may be mono. The sample rate frequency can be e.g. one of the following: 8 kHz, 11.025 kHz, 16 kHz, 22.05 kHz, 32 kHz, 44.1 kHz or 48 kHz For an incoming signal with a very low sample frequency, for instance of 8 kHz, the LP frequency cut-off frequency is set at fs/2, i.e. at 4 kHz, the HP cut-off frequency is then set at for instance 400 Hz, for a sample frequency of 16 kHz the HP cut-off frequency is set at 200 Hz, and so forth. So the sample frequency fs then establishes the LP cut-off frequency, and the HP cut-off frequency is matched to the LP cut-off frequency.

In embodiments the AGC (Automatic Gain Control) acts block based, meaning that the gain factor only changes per block. In this way the computational power is kept to a minimum.

The gain may be calculated for instance as follows:

First of all, the running RMS (Root Mean Square) value of the input signal is computed. This RMS value is a smoothed average based on the recent "history" of the signal waveform. Then the peak value is calculated using a look-ahead time in order to anticipate to upcoming signal peaks.

With the RMS and the peak value, the crest-factor is computed. A so-called "depeak" factor is used to specify how hard the algorithm can clip peaky signals (high values will yield more clipping). Afterwards the gain is computed and is compared with the maximal allowed gain, which can be set by the user, and the minimal value of the two is chosen. Although not shown here the maximum allowed gain setting can be an input for the high pass filter, wherein the cut-off frequency is a function (or more in general one or more characteristics of the filter, which could apart from the value of the cut-off frequency also or alternatively e.g. include switching from a first order to a second order) of the maximum allowed gain setting.

The maximum allowed gain setting can be an input for the high pass filter, wherein the cut-off frequency is a function (or more in general one or more characteristics of the filter, which could apart from the value of the cut-off frequency also or alternatively e.g. include switching from a first order to a second order) of the maximum allowed gain setting.

Figure 10:
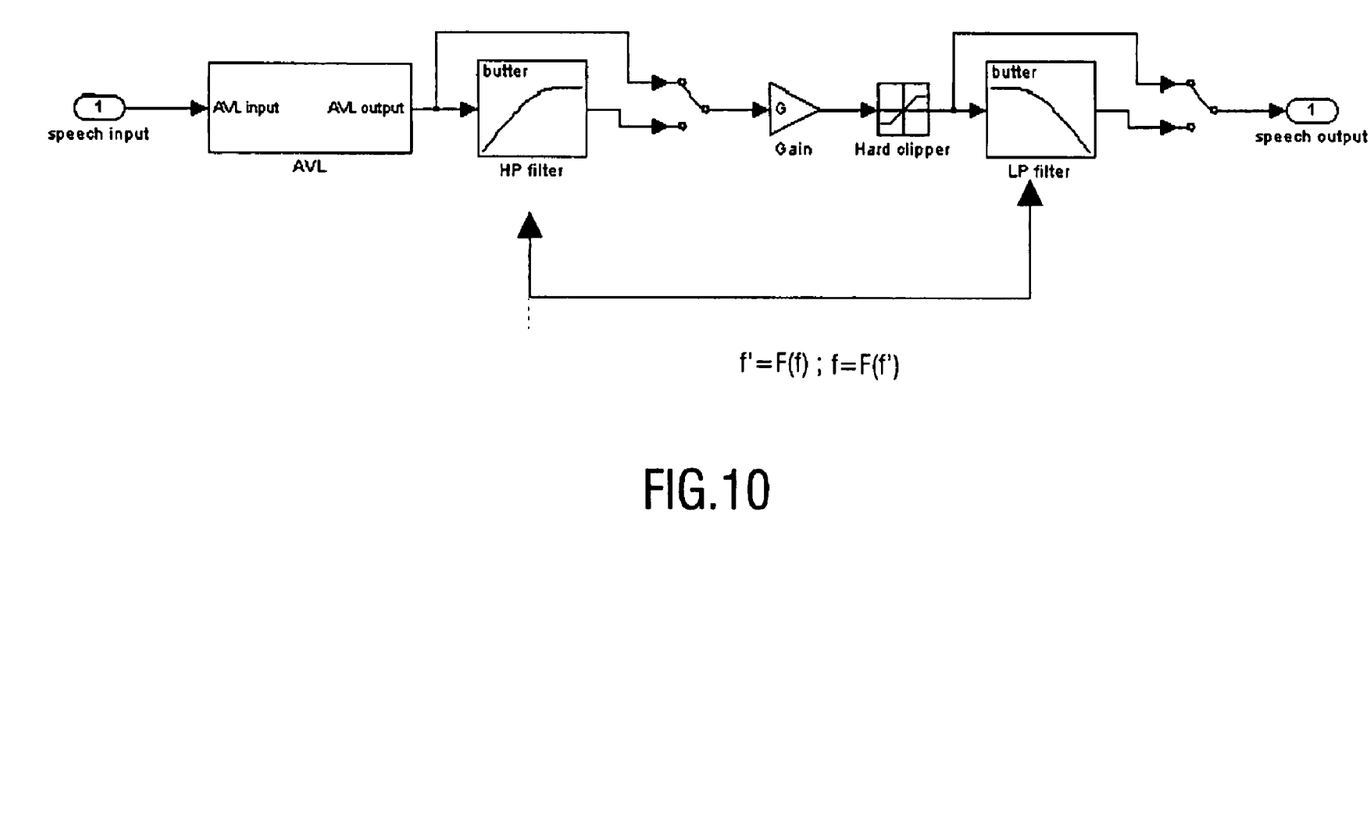
FIG. 10 illustrates a different type of embodiment.

FIG. 9 illustrates one type of embodiments of the invention, FIG. 10 is directed to a different type of embodiments.

Basically these embodiments comprise a number of elements or steps:

1. an AVL (Automatic Volume Leveler): the AVL is a signal dependant processing block, keeping the volume of the incoming signal at an approximately constant level,
2. a (first order) HP (high pass) filter: this filter removes a part of the lower frequencies, creating headroom for amplification
3. a gain: increasing the SPL (Sound Pressure Level) of the signal, i.e. amplifying the signal
4. a clipper in preferred embodiments, preferably a hard clipper when a simple system is preferred: the signal is clipped at a certain amplitude, to assure linear operation of the analogue amplifier (after D/A conversion). Instead of a hard clipper, which simply clips the signal above the clipping level, a soft clipper may also be used, which clips the signal above a clipping level but also attenuates the signal at level close to the clipping level. Using a soft-clipper restores to some extent the dynamic behavior of the signal, increasing intelligibility.
5. a LP (low pass) filter: the filter restores or at least improves the balance between mid-range frequencies and high frequencies, an unbalance makes the sound unnatural, and the signal sounds rather harsh; this LP filter makes the processed sound more pleasant to listen to. The cut-off frequencies of the HP and LP filters are matched.

In this example the input is a speech input, but it is remarked that the input may be any sound signal.

Figure 11:
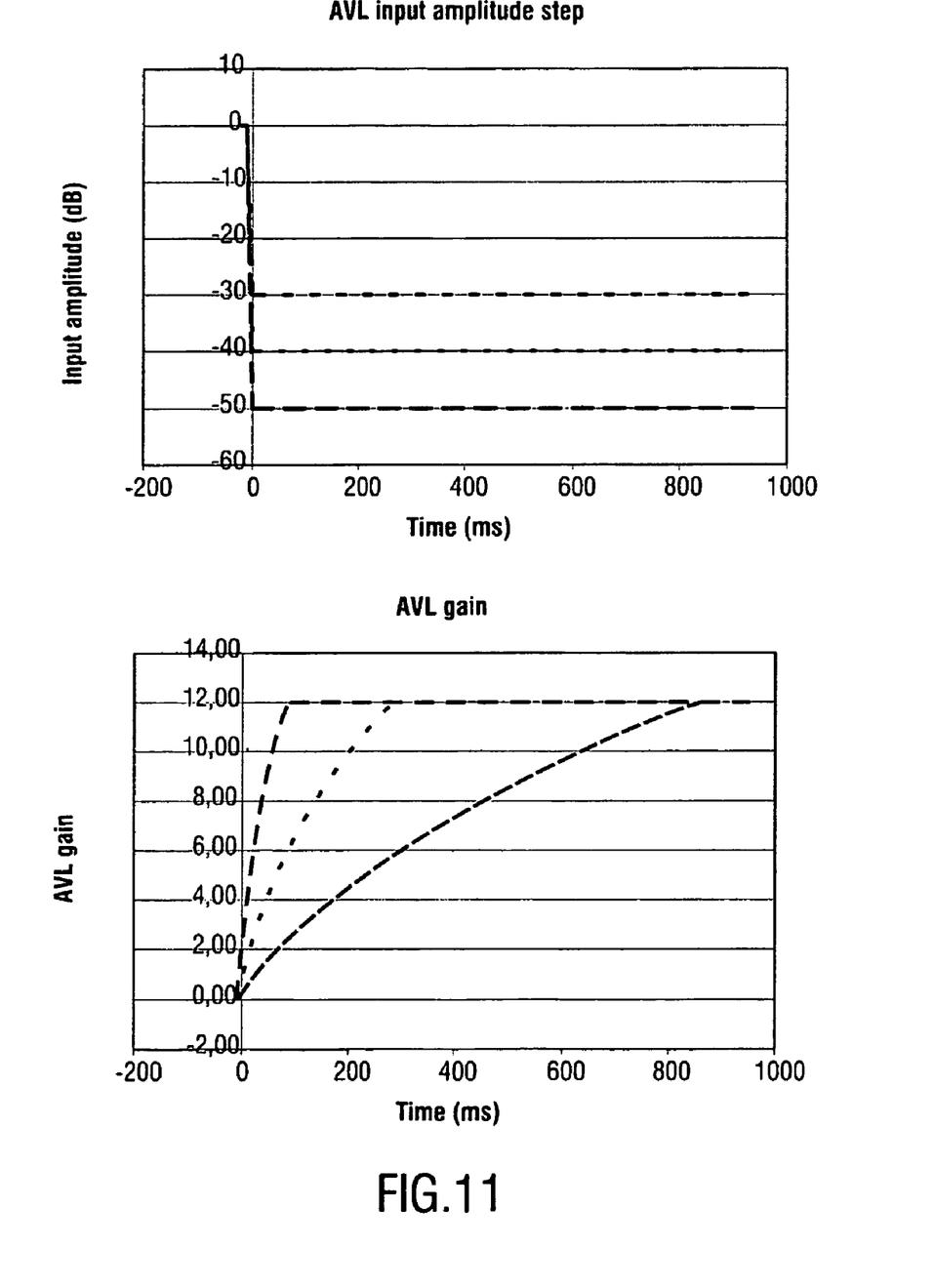
FIG. 11 illustrates the AVL behavior of an AVL.

An exemplary AVL behavior is also shown in FIG. 11.

The left graph shows the step change of the amplitude of three input signals. The right graph shows that the AVL gain increases faster for large changes in amplitude. This is a preferred embodiment further improving intelligibility.

Figure 12:
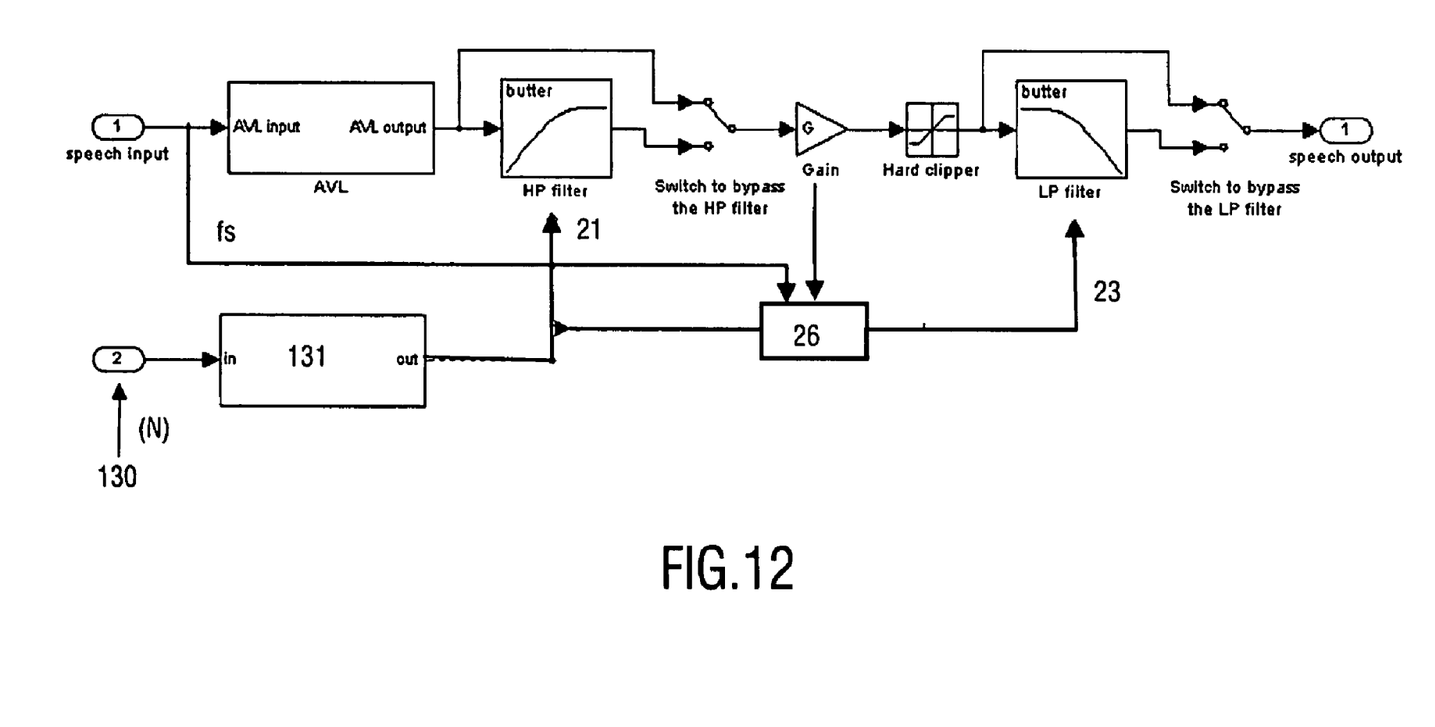
FIG. 12 illustrates a preferred embodiment in which parameters are adapted in dependence on a measured noise level.

FIG. 12 illustrates an example of a device similar to the one shown in FIG. 10 in which a sensor (measuring system) 130 for measuring background noise, such as e.g. a separate microphone, is used. The device comprises an establisher 131 for the establishing of the cut-off frequency of the HP-Filter. It is remarked that, although not shown, other parameters, such as the gain, the clipping, the settings of the AVL may be made dependent on the measured noise level.

The noise measurement may, in preferred simple embodiments, give a single data expressing the overall noise S or may give a noise figures for different noise band $S_{f1}$, $S_{f2}$, $S_{f3}$ etc. If noise figures are measured for different noise bands an average or total noise may be calculated for instance $S_{av} = \Sigma S_{fi}$, or weighted according to a dB(A) scale for instance $S_{av} = \Sigma w_i S_{fi}$ where $w_i$ are weighting coefficients of the dB(A) scale. The noise level is measured by an amplitude measurement.

The HP cut-off frequency is adapted to the measured noise. The higher the noise level the larger the cut-off frequency. For adaptive-embodiments the cut-off frequency may advantageously range over a broader range than for non-adaptive embodiments. The HP cut-off frequency f advantageously range between 50 Hz (for situations in which there is substantially no noise) to typically up to 2 kHz for high-noise-level situations.

The HP filter cut-off frequency is thus updated according to the amount of environmental noise, and ranges typically from a very low value e.g. 50 Hz (no environmental noise) and 2 kHz (loud environmental noise). More low frequencies are removed in loud noisy environments to create more headroom to amplify the signal afterwards. A maximum of 2 kHz is recommended to avoid removal of frequencies contributing to the speech intelligibility. The filter coefficients are calculated at run-time.

The relation between cut-off frequency to noise level is preferably set as follows: $f_{cut-off} = f_0 + \Delta f(S)$ where $f_0$ is the low noise limit (e.g. 50, 100 or 300 Hz) and $\Delta f$ is a higher than linear (proportional to $S^i$ where i is greater than 1) function of the noise level.

The matcher 26 matches the LP cut-off frequency to the established HP cut-off frequency, i.e. f' is set by f'=F(f).

In the absence of noise the cut-off frequency is set at the high limit e.g. $f_s/2$.

For maximum noise the cut-off frequency is set at the lower limit, e.g. 2 kHz.

FIG. 12 schematically illustrates that the matching itself may be dependent on the gain level, and on the sample frequency fs. In preferred embodiments the matcher may operate two ways, i.e. depending on the sample frequency and the measured noise the LP cut-off frequency is matched to the HP cut-off frequency or the other way around.

In these embodiments the algorithm used is designed to operate adaptively, driven by the amount of environment (near-end) noise. This results in a user-friendly system feature that allows the system user to use its system (e.g. a GSM) in varying conditions concerning environmental noise, without the need of any further interaction to control the GSM volume level.

When used in adaptive processing mode, the parameters of the processing blocks are adapted for incoming samples according to the environmental noise. The algorithm adapts parameters according to the environmental noise. The amount of noise may be measured by a separate microphone or estimated using the system (GSM) microphone (for a single microphone application).

When the environmental noise decreases in volume the parameters are preferably adapted very quickly such that the naturalness and warmth of the incoming signal are restored.

The term 'no environmental noise' does not mean complete silence, but regular noises such as fan noise, background music, etc. In a typical environment, the background noise is typically around 50 dB(A). The term 'loud environmental noise' refers to the noise of a passing train or subway, noise inside a dance club, etc. These noises can measure up to 100 dB(A).

The noise may be measured by measuring spectral amplitude information of the environmental noise and calculating a single value representing the amount of noise.

The relation between the cut-off frequency and the measured noise (or more in general any parameter on which the cut-off frequency is dependent) is not necessarily linear.

Tests using linear interpolation showed that for 'medium' environmental noises, the algorithm effect was too large.

Using a higher, for instance second or third order interpolation, the effect is smaller compared to linear interpolation for the same environmental noise. For loud environmental noises, the amount of effect is equal.

The system in preferred embodiments comprises an adaptor for adapting in addition to the cut-off frequency of the HP filter one more of additional parameters in dependence on the measured background noise level. Such parameters are e.g. the order of the high-pass filter.

In short the invention can be described as follows:

A sound reproduction system comprising a digital audio signal input (1), a digital audio signal processor (2, DSP) and a digital audio signal output (3) wherein the digital signal processor (2, DSP) comprises a high pass (HP) filter (21) with a high pass frequency (f), an amplifier (22) for a signal filtered by the HP filter, and a low pass (LP) filter (23) with a low pass frequency (f') for filtering the signal after amplification by the amplifier (22) and for providing an output signal, and the digital processor comprises an establisher (24, 25) for establishing the high pass frequency or the low pass frequency and a matcher (26) for matching the high pass frequency and low pass frequency of the high pass filter and low pass filter respectively to each other.

Matching of the HP and LP cut-off frequencies, matches the effect of these filters on the perceived speech. In particular it reduces a shrillness of sound which would otherwise be heard.

The invention may be used in various systems. The invention is in particular useful for hands free mobile phones. However, it is applicable for all sound reproduction systems, especially those which run on a system with a limited voltage supply and/or small loudspeaker. A list of possible applications:

handsets (mobile phone, DECT, etc.);
portable systems, e.g. a portable DVD player
PDA'S;
car-kits
TV's; computers;
web-terminals;
answering machines;

It will be appreciated by persons skilled in the art that the present invention is not limited by what has been particularly shown and described hereinabove. The invention resides in each and every novel characteristic feature and each and every combination of characteristic features. Reference numerals in the claims do not limit their protective scope. Use of the verb "to comprise" and its conjugations does not exclude the presence of elements other than those stated in the claims. Use of the article "a" or "an" preceding an element does not exclude the presence of a plurality of such elements.

The present invention has been described in terms of specific embodiments, which are illustrative of the invention and not to be construed as limiting. The invention may be implemented in hardware, firmware or software, or in a combination of them. Other embodiments are within the scope of the following claims.

Many further variations are possible within the concept of the invention.

The invention claimed is:

1. A sound reproduction system comprising:
   a digital audio signal input;
   a digital audio signal processor;
   a digital audio signal output,
   a sensor that measures a background noise level, and
   an element having as an input the measured noise level and as an output a HP cut-off frequency, wherein the HP cut-off frequency increases as the background noise level increases, and a LP cut-off frequency decreases as the HP cut-off frequency increases, and wherein the digital audio signal processor comprises:
      a high pass (HP) filter, with a HP frequency (f), that filters a signal,
      an amplifier that amplifies the filtered signal,
      a low pass (LP) filter, with a LP frequency (f), that filters the amplified signal and provides an output signal,
      an establisher that establishes either the HP frequency or the LP frequency, and
      a matcher that matches the HP frequency and the LP frequency of the HP filter and the LP filter respectively to each other.

2. A sound reproduction system as claimed in claim 1, further comprising:
   a single LP filter with a variable cut-off frequency.

3. A sound reproduction system as claimed in claim 1, further comprising:
   a set of LP filters with a different LP cut-off frequency, wherein the matcher is arranged to send the signal after amplification to one of the set of LP filters, in dependence on the HP cut-off frequency.

4. A sound reproduction system as claimed in claim 1, wherein the establisher is arranged for establishing the cut-off frequency of the HP filter in dependence on the average amplification in the amplification stage.

5. A sound reproduction system as claimed in claim 1, wherein the establisher is arranged to set the cut-off frequency f' of the LP filter at $f_s/2$, wherein $f_s$ is a sample frequency and the matcher matches the HP frequency f to the LP frequency f'.

6. A sound reproduction system as claimed in claim 5, further comprising:
a single HP filter with a variable cut-off frequency.

7. A sound reproduction system as claimed in claim 5, further comprising:
a set of HP filters with a different HP cut-off frequency, wherein the matcher is arranged to send the signal before amplification to one of the set of HP filters, in dependence on the LP cut-off frequency.

8. A sound reproduction system as claimed in claim 1, wherein the HP cut-off frequency (f) is a frequency between 300 Hz and 2 kHz.

9. A sound reproduction system as claimed in claim 1, wherein the LP cut-off frequency lies above 2 kHz and $f_s/2$, where $f_s$ is a sample frequency.

10. A digital audio signal processor comprising:
a high pass (HP) filter, with a HP frequency (f), that filters a signal;
an amplifier that amplifies the filtered signal; and
a low pass (LP) filters, with a LP frequency (f'), that filters the amplified signal and provides an output signal;
an establisher that establishes either the HP frequency or the LP frequency;
a matcher that matches the HP frequency and the LP frequency respectively to each other; and
an element having as an input a measured noise level from a sensor, the sensor measuring a background noise level, and, as an output, a HP cut-off frequency, wherein the HP cut-off frequency increases as the background noise level increases, and a LP cut-off frequency decreases as the HP cut-off frequency increases.

11. A method for processing digital sound signals in a digital audio signal processor, the method comprising:
using a high pass filter to remove frequency components below a HP cut-off frequency f, thereby producing a filtered signal in the digital audio signal processor;
using an amplifier to amplify the filtered signal, thereby producing an amplified signal;
using a low pass filter to remove frequency components above a LP cut-off frequency from the amplified signal;
using a matcher to match the values of the HP cut-off frequency and the LP cut-off frequency f';
using a sensor to measure a background noise level; and
adapting a HP cut-off frequency to the measured noise level, wherein the HP cut-off frequency increases as the background noise level increases, and a LP cut-off frequency decreases as the HP cut-off frequency increases.

12. A method as claimed in claim 11, wherein the HP cut-off frequency lies between 300 and 2 kHz.

* * * * *